(12) United States Patent
Karim et al.

(10) Patent No.: US 11,651,963 B2
(45) Date of Patent: May 16, 2023

(54) METHOD OF IMPROVING DEPOSITION INDUCED CD IMBALANCE USING SPATIALLY SELECTIVE ASHING OF CARBON BASED FILM

(71) Applicant: Lam Research Corporation, Fremont, CA (US)

(72) Inventors: Ishtak Karim, San Jose, CA (US); Pulkit Agarwal, Beaverton, OR (US); Joseph R. Abel, West Linn, OR (US); Purushottam Kumar, Hillsboro, OR (US); Adrien Lavoie, Newberg, OR (US)

(73) Assignee: Lam Research Corporation, Fremont, CA (US)

( * ) Notice: Subject to any disclaimer, the term of this patent is extended or adjusted under 35 U.S.C. 154(b) by 142 days.

(21) Appl. No.: 17/204,758

(22) Filed: Mar. 17, 2021

(65) Prior Publication Data
US 2021/0202250 A1 Jul. 1, 2021

Related U.S. Application Data

(62) Division of application No. 15/974,172, filed on May 8, 2018, now Pat. No. 10,978,302.

(60) Provisional application No. 62/591,949, filed on Nov. 29, 2017.

(51) Int. Cl.
*H01L 21/311* (2006.01)
*H01L 21/033* (2006.01)
(Continued)

(52) U.S. Cl.
CPC ...... *H01L 21/0337* (2013.01); *H01L 21/0228* (2013.01); *H01L 21/0273* (2013.01);
(Continued)

(58) Field of Classification Search
CPC ............ H01L 21/0337; H01L 21/0228; H01L 21/31144
(Continued)

(56) References Cited

U.S. PATENT DOCUMENTS

| 7,494,934 B2 | 2/2009 | Bai |
| 2012/0016846 A1 | 6/2012 | Ha et al. |

(Continued)

FOREIGN PATENT DOCUMENTS

| KR | 10-1171813 | 8/2012 |
| KR | 10-1719407 | 7/2016 |

(Continued)

OTHER PUBLICATIONS

International Search Report from International Application No. PCT/US2018/061347 dated Mar. 6, 2019.
(Continued)

*Primary Examiner* — Caleb E Henry
*Assistant Examiner* — Dilinh P Nguyen
(74) *Attorney, Agent, or Firm* — Beyer Law Group LLP

(57) ABSTRACT

A method for forming features over a wafer with a carbon based deposition is provided. The carbon based deposition is pretuned, wherein the pretuning causes a non-uniform removal of some of the carbon based deposition. An oxide deposition is deposited through an atomic layer deposition process, wherein the depositing the oxide deposition causes a non-uniform removal of some of the carbon based deposition. At least one additional process is provided, wherein the at least one additional process completes formation of features over the wafer, wherein the features are more uniform than features that would be formed without pretuning.

12 Claims, 9 Drawing Sheets

(51) Int. Cl.
*H01L 21/02* (2006.01)
*H01L 21/027* (2006.01)

(52) U.S. Cl.
CPC .. *H01L 21/02164* (2013.01); *H01L 21/02219* (2013.01); *H01L 21/02274* (2013.01); *H01L 21/31144* (2013.01); *H01L 21/31138* (2013.01)

(58) Field of Classification Search
USPC ........................................................ 438/703
See application file for complete search history.

(56) References Cited

U.S. PATENT DOCUMENTS

| 2012/0164846 A1* | 6/2012 | Ha ................... H01L 21/02153 |
| | | 257/E21.271 |
| 2016/0336178 A1 | 11/2016 | Swaminathan et al. |
| 2019/0164757 A1 | 5/2019 | Karim et al. |

FOREIGN PATENT DOCUMENTS

| WO | 2016-054531 | 4/2016 |
| WO | 2017-026676 | 2/2017 |

OTHER PUBLICATIONS

Written Opinion from International Application No. PCT/US2018/061347 dated Mar. 6, 2019.
International Preliminary Report on Patentability dated Jun. 2, 2020 from International Application No. PCT/US2018/061347.

\* cited by examiner

METHOD OF IMPROVING DEPOSITION INDUCED CD IMBALANCE USING SPATIALLY SELECTIVE ASHING OF CARBON BASED FILM

CROSS REFERENCE TO RELATED APPLICATION

This application is a divisional of U.S. application Ser. No. 15/974,172 dated May 8, 2018, which claims the benefit of priority of U.S. Provisional Application No. 62/591,949, filed Nov. 29, 2017, which is incorporated herein by reference for all purposes.

BACKGROUND

The present disclosure relates to the formation of semiconductor devices. More specifically, the disclosure relates to the formation of semiconductor devices where pattern multiplication is used to double or quadruple a mask density or line frequency. Such pattern multiplication may form oxide spacers around carbon features and then remove the carbon features, leaving the oxide spacers to act as a mask.

SUMMARY

To achieve the foregoing and in accordance with the purpose of the present disclosure, a method for forming features over a wafer with a carbon based deposition is provided. The carbon based deposition is pretuned, wherein the pretuning causes a non-uniform removal of some of the carbon based deposition. An oxide deposition of a silicon oxide ($SiO_2$) based material is deposited through an atomic layer deposition process, wherein the depositing the oxide deposition causes a non-uniform removal of some of the carbon based deposition, which is complementary to the non-uniform removal of some of the carbon based deposition by the pretuning.

In another manifestation, a method for forming features over a wafer with a carbon based deposition is provided. The carbon based deposition is pretuned, wherein the pretuning causes a non-uniform removal of some of the carbon based deposition. An oxide deposition is deposited through an atomic layer deposition process, wherein the depositing the oxide deposition causes a non-uniform removal of some of the carbon based deposition. At least one additional process is provided, wherein the at least one additional process completes formation of features over the wafer, wherein the features are more uniform than features that would be formed without pretuning.

These and other features of the present disclosure will be described in more detail below in the detailed description of the disclosure and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION

Figure 1:
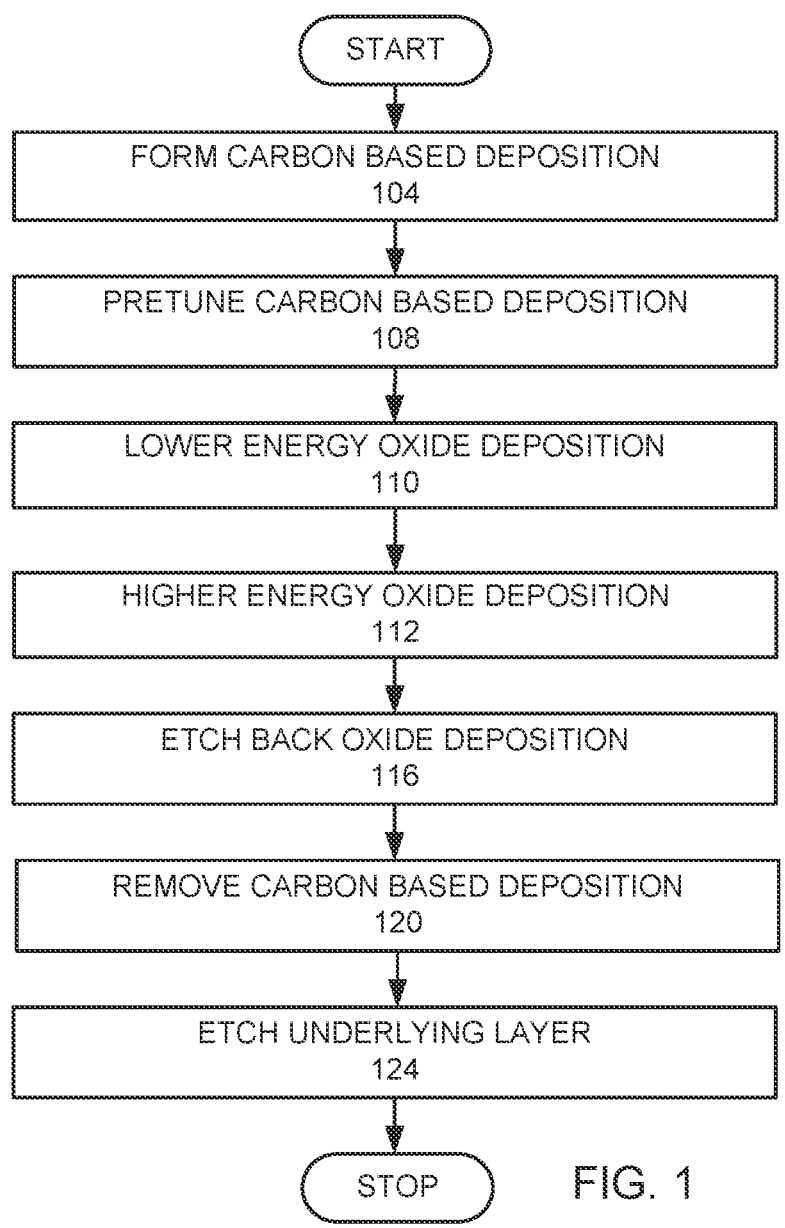
FIG. 1 is a high level flow chart of an embodiment.

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

In a common multi-patterning scheme, a carbon based film is deposited and patterned to define an initial structure. An oxide spacer film is then deposited over the carbon based film. The oxide spacer film may be etched to expose the carbon based film, leaving oxide spacers on sides of carbon based film features. The carbon based film is removed leaving oxide spacers with twice the frequency and half the spacing and CD between features. If the process is repeated N times, the CD of the final structure would be $2^{-N}$ of the initial structure of the carbon film. The deposition of the oxide spacer film and subsequent etching removes some of the carbon film in a non-uniform way across a wafer. Such a non-uniform removal of carbon is called loss non-uniformity (NU) across the wafer. In an example, more of the carbon film is removed within 3 cm of the edge of the wafer compared to the remaining parts of a wafer.

Conventional technology relies on tuning the deposition plasma itself to attempt to minimize the loss NU across the wafer. An obvious issue with this approach is the coupling of the carbon core loss profile and the oxide film thickness profile. If the plasma is already optimized for minimizing the film thickness NU, then re-optimizing for minimizing the loss NU may significantly degrade the former. This is a classical case of one knob trying to optimize two parameters simultaneously.

Another conventional method may be to tune the carbon core etch profile across the wafer to compensate for the loss NU imparted by the deposition process. However, etch profile tuning is often non-trivial and there is general unwillingness to modify a complex etch process to compensate for shortcomings in the deposition process.

One of the issues with the above scheme is the carbon core loss that can occur during plasma-enhanced ALD oxide deposition. The loss is mainly caused by oxygen radicals that are necessary to grow the oxide film, but may also be caused by heavy ions such as argon (Ar) that may also be present in the plasma. The loss is an adverse consequence of the oxide deposition process and may vary across the wafer. This, in turn, can shift the CD of the final structure differentially across the wafer; e.g. $CD|_{edge} < CD|_{center}$. Hence, it would be difficult to achieve the target CD everywhere on the wafer without making the deposition plasma very uniform.

To facilitate understanding, FIG. 1 is a high level flow chart of an embodiment. A carbon based deposition is deposited over a wafer (step 104). The carbon based deposition is pretuned where the pretuning causes a non-uniform removal of some of the carbon based deposition (step 108). A lower energy atomic layer deposition (ALD) process is used to deposit an oxide deposition (step 110), where the lower energy ALD process does not remove or minimally removes some of the carbon based deposition. A higher energy ALD process is used to deposit an oxide deposition (step 112), where the depositing the oxide deposition causes a non-uniform removal of some of the carbon based deposition that is complementary to the non-uniform removal of some of the carbon based deposition by the pretuning. The oxide deposition is a silicon oxide based material. The oxide deposition is etched back (step 116). The carbon based deposition is removed (step 120). An underlying layer is etched, where the oxide deposition is used as a mask (step 124).

Example

Figure 2:
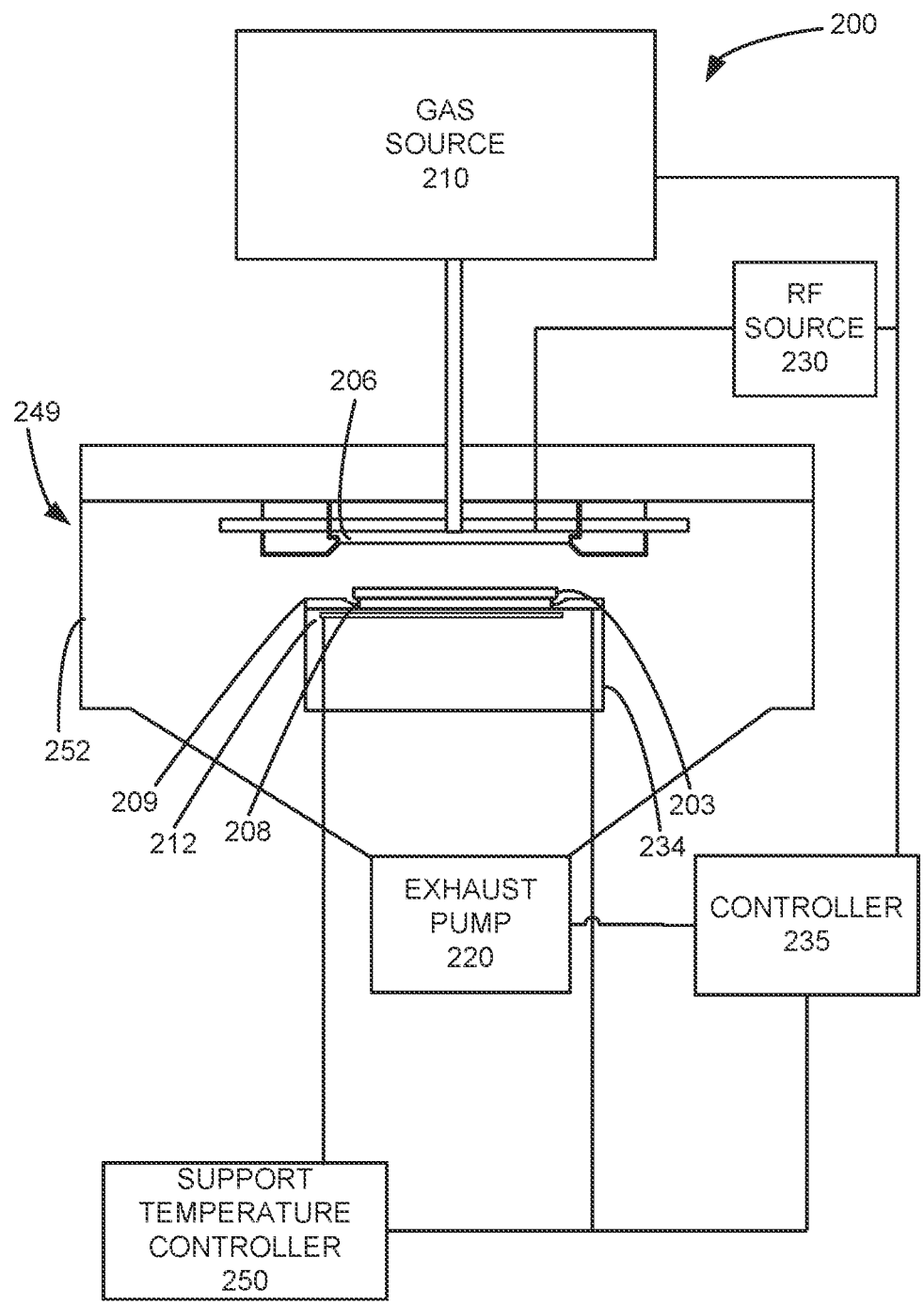
FIG. 2 is a schematic view of a process chamber that may be used in an embodiment.

FIG. 2 is a schematic view of a process chamber which may be used in an embodiment. In one or more embodiments, a process chamber 200 comprises a gas distribution plate 206 providing a gas inlet and a wafer support 208, within a chamber 249, enclosed by a chamber wall 252. Within the chamber 249, a wafer 203 is positioned over the wafer support 208. An edge ring 209 surrounds the wafer support 208. A gas source 210 is connected to the chamber 249 through the gas distribution plate 206. A support temperature controller 250 is connected the wafer support 208. A radio frequency (RF) source 230 provides RF power to an upper electrode, which in this embodiment is the gas distribution plate 206. In an exemplary embodiment, 400 kHz, 13.56 MHz, and optionally 2 MHz, 27 MHz power sources make up the RF source 230. In this embodiment, the wafer support 208 is grounded. In this embodiment, one generator is provided for each frequency. In other embodiments, the generators may be in separate RF sources, or separate RF generators may be connected to different electrodes. For example, the upper electrode may have inner and outer electrodes connected to different RF sources. Other arrangements of RF sources and electrodes may be used in other embodiments. A controller 235 is controllably connected to the RF source 230, an exhaust pump 220, and the gas source 210. An example of such a chamber is the Striker™ Oxide system manufactured by Lam Research Corporation of Fremont, Calif.

Figure 3:
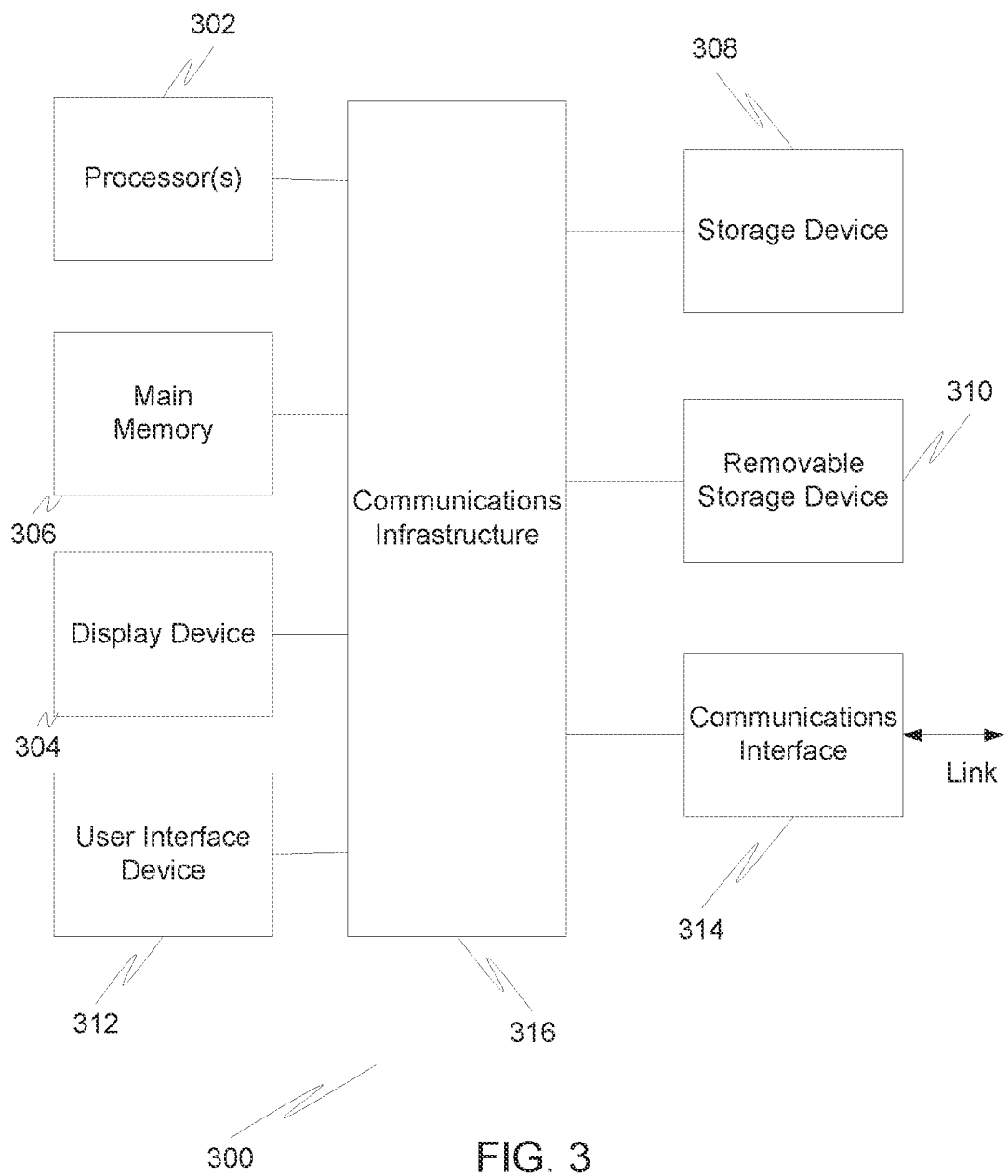
FIG. 3 is a schematic view of a computer system that may be used in practicing an embodiment.

FIG. 3 is a high level block diagram showing a computer system 300, which is suitable for implementing a controller 235 used in embodiments. The computer system may have many physical forms ranging from an integrated circuit, a printed circuit board, and a small handheld device up to a huge super computer. The computer system 300 includes one or more processors 302, and further can include an electronic display device 304 (for displaying graphics, text, and other data), a main memory 306 (e.g., random access memory (RAM)), storage device 308 (e.g., hard disk drive), removable storage device 310 (e.g., optical disk drive), user interface devices 312 (e.g., keyboards, touch screens, keypads, mice or other pointing devices, etc.), and a communications interface 314 (e.g., wireless network interface). The communications interface 314 allows software and data to be transferred between the computer system 300 and external devices via a link. The system may also include a communications infrastructure 316 (e.g., a communications bus, cross-over bar, or network) to which the aforementioned devices/modules are connected.

Information transferred via communications interface 314 may be in the form of signals such as electronic, electromagnetic, optical, or other signals capable of being received by communications interface 314, via a communication link that carries signals and may be implemented using wire or cable, fiber optics, a phone line, a cellular phone link, a radio frequency link, and/or other communication channels. With such a communications interface, it is contemplated that the one or more processors 302 might receive information from a network, or might output information to the network in the course of performing the above-described method steps. Furthermore, method embodiments may execute solely upon the processors or may execute over a network such as the Internet, in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM, and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 4A:
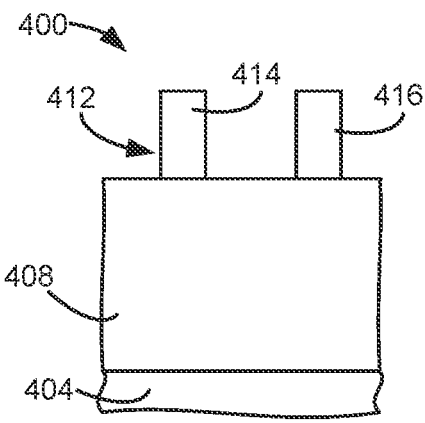
FIGS. 4A-F are schematic cross-sectional views of a stack processed according to an embodiment.

In an example of an implementation of the embodiment, a carbon based deposition is formed over a wafer (step 104). FIG. 4A is a schematic cross sectional view of part of a stack 400 with a wafer 404 disposed below an intermediate layer 408, disposed below a carbon based deposition 412. In this example, the carbon based deposition 412 is an organic patterned mask, such as a photoresist mask, with a first mask feature 414 and a second mask feature 416. One or more layers (not shown) may be disposed between the wafer 404 and the intermediate layer 408. One or more layers (not shown), such as an antireflective coating, may also be disposed between the intermediate layer 408 and the carbon based deposition 412.

Figure 4B:
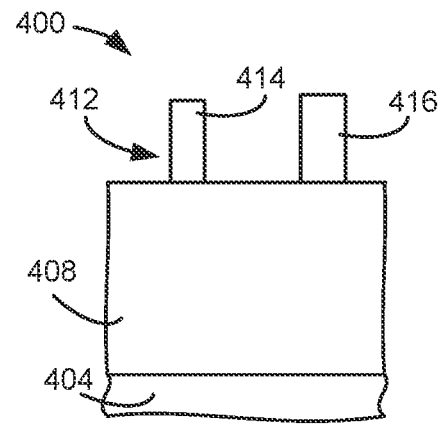
Figure 5:
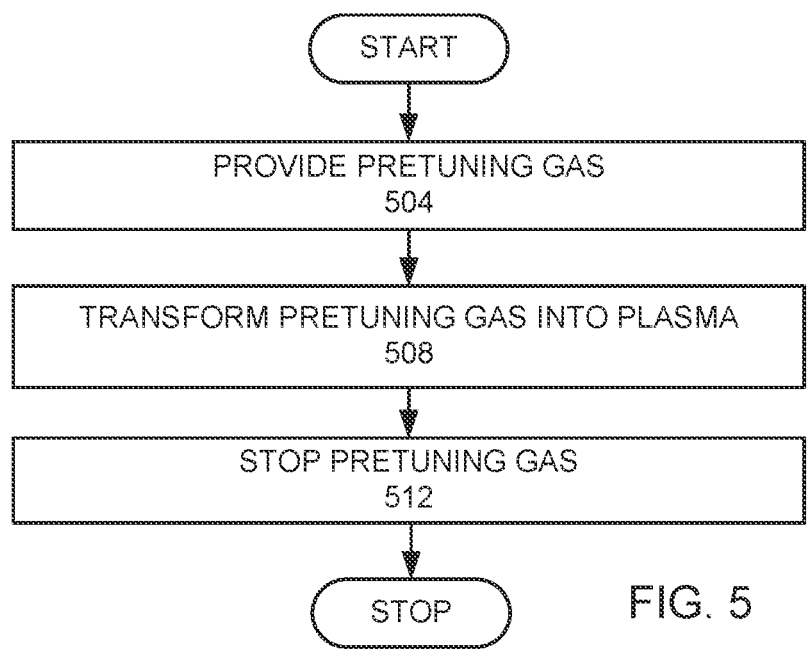
FIG. 5 is a more detailed flow chart of a pretuning process.

The carbon based deposition is pretuned, wherein the pretuning causes a non-uniform removal of some of the carbon based deposition. FIG. 5 is a more detailed flow chart of the step of pretuning. A pretuning gas is provided is flowed into the process chamber (step 504). In this example, the pretuning gas is 1000 sccm $O_2$, 1500 sccm Ar, and 25,000 sccm $N_2$. The pretuning gas is transformed into a plasma (step 508). In this example, 750 watts of RF are provided at a frequency of 13.56 MHz. A bias of 15 volts is provided. After 3 seconds, the flow of the pretuning gas into the process chamber is stopped (step 512). FIG. 4B is a cross sectional view of the stack 400 after the carbon based deposition 412 has been pretuned (step 108). Generally, the NU is across a wafer 404, where the center of a wafer 404 may not be uniformly processed with respect to features at the edge of the wafer. FIG. 4B schematically illustrates nonuniformity in features that are illustrated as being side by side, where such nonuniformity is actually in features that are spaced apart. In addition, certain aspects have been exaggerated in order to illustrate general aspects of the embodiment. In this example, some of the first mask feature 414 is removed by the pretuning and none of the second mask feature 416 is removed by the pretuning.

Figure 6:
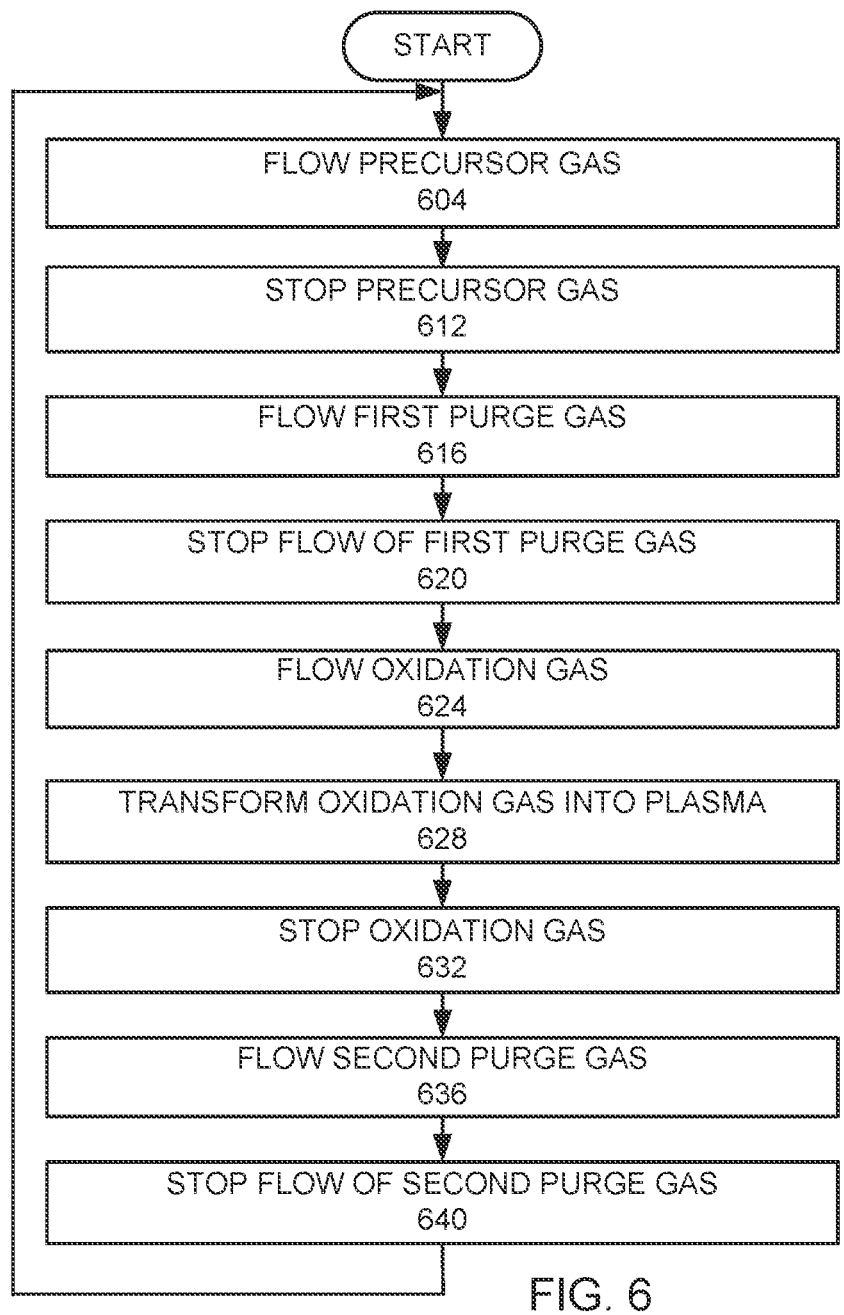
FIG. 6 is a more detailed flow chart of a lower energy oxide deposition.

A lower energy oxide deposition is deposited on the carbon based deposition (step 110) through an ALD process. FIG. 6 is a more detailed flow chart of the lower energy oxide deposition (step 110). A precursor gas flowed into the process chamber (step 604). In this example the precursor gas is 400 sccm aminosilane. After 0.4 second, the flow of the precursor gas into the process chamber is stopped (step 612). A silicon containing precursor layer is deposited over the carbon based deposition 412. A first purge gas is flowed into the process chamber (step 616). In this example, the first purge gas is argon and oxygen ($O_2$). The flow of the first purge gas is stopped (step 620). An oxidation gas flowed into the process chamber (step 624). In this example the oxidation gas is 13,000 sccm Ar and 1500 sccm $O_2$. The oxidation gas is transformed into a plasma (step 628). In this example, 100 to 500 watts of RF are provided at a frequency of 13.56 MHz. After 0.25 seconds, the flow of the oxidation gas into the process chamber is stopped (step 632). The plasma from the oxidation gas transforms the deposited silicon containing precursor layer into silicon oxide. A second purge gas is flowed into the process chamber (step 636). The flow of the second purge gas is stopped (step 640). The cycle then repeats from the step of flowing the precursor gas into the process chamber (step 604). In this example, the process is repeated for 2 to 10 cycles. The lower energy oxide deposition (step 110) is performed at a sufficiently low energy for depositing a silicon oxide layer, with minimal damage to the carbon based deposition 412.

Figure 7:
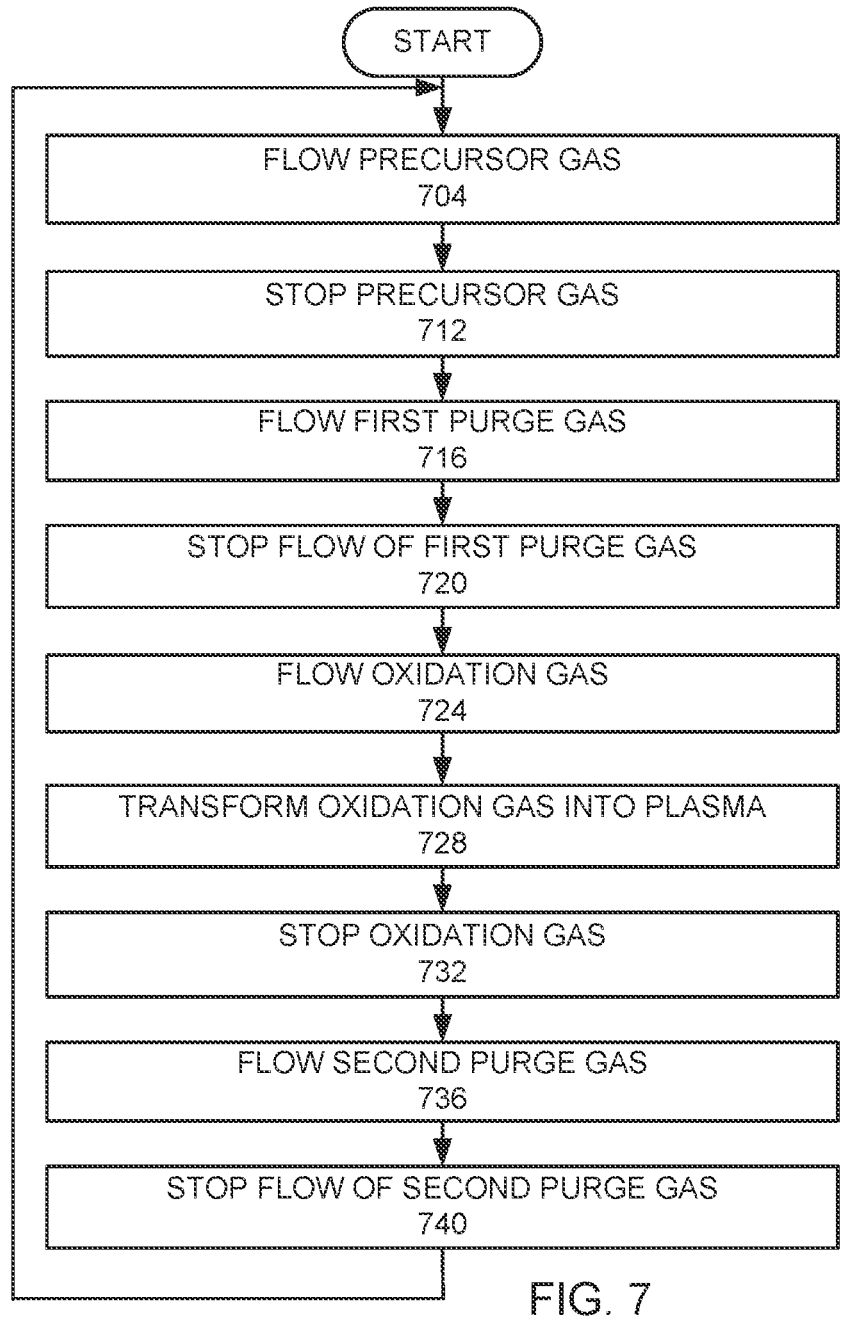
FIG. 7 is a more detailed flow chart of a higher energy oxide deposition.

A higher energy oxide deposition is deposited on the carbon based deposition (step 112) through an ALD process. FIG. 7 is a more detailed flow chart of the higher energy oxide deposition (step 112). A precursor gas flowed into the process chamber (step 704). In this example the precursor gas is 400 sccm aminosilane. After 0.25 seconds, the flow of the precursor gas into the process chamber is stopped (step 712). A silicon containing precursor layer is deposited over the carbon based deposition 412. A first purge gas is flowed into the process chamber (step 716). In this example, the first purge gas is argon and oxygen. The flow of the first purge gas is stopped (step 720). An oxidation gas flowed into the process chamber (step 724). In this example the oxidation gas is 13,000 sccm Ar and 1500 sccm $O_2$. The oxidation gas is transformed into a plasma (step 728). In this example, 800 to 1200 watts of RF are provided at a frequency of 13.56 MHz. In this example, the RF power provided during the higher energy oxide deposition is higher than the RF power provided during the lower energy oxide deposition. More preferably, the RF power provided during the higher energy oxide deposition is at least 300 watts higher than the RF power provided during the lower energy oxide deposition. In some embodiments, the RF power provided during the higher energy oxide deposition is at least twice the RF power provided during the lower energy oxide deposition. After 0.4 seconds, the flow of the oxidation gas into the process chamber is stopped (step 732). The plasma from the oxidation gas transforms the deposited silicon containing precursor layer into silicon oxide. A second purge gas is flowed into the process chamber (step 736). The flow of the second purge gas is stopped (step 740). The cycle then repeats from the step of flowing the precursor gas into the process chamber (step 704). In this example, the process is repeated for 126 to 134 cycles. The higher energy oxide deposition (step 112) imparts less damage to the carbon based deposition 412 due to the protective film formed during the preceding lower energy oxide deposition.

Figure 4C:
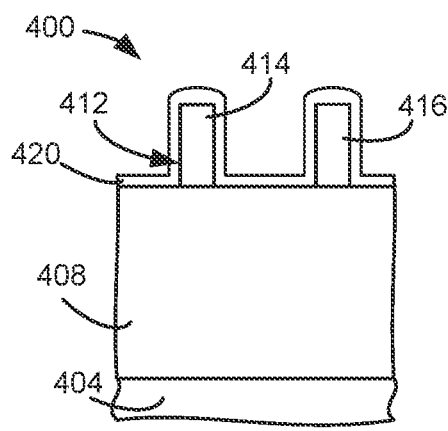

FIG. 4C is a cross sectional view of the stack 400 after the higher energy oxide deposition is deposited on the carbon based deposition 412 (step 112). In this example, the oxide deposition 420 has unevenly removed the carbon based deposition 412, by removing more of the second mask feature 416 than the first mask feature 414. The non-uniform removal of the carbon based deposition by the depositing the oxide deposition 420 is complementary to the non-uniform removal of some of the carbon based deposition 412 by the pretuning in that the combination of the non-uniform removal of some of the carbon based deposition by the depositing the oxide deposition and the non-uniform removal of some of the carbon based deposition by the pretuning results in a more uniform removal of the carbon based deposition than the non-uniform removal of some of the carbon based deposition by the depositing the oxide deposition alone. In this example, the amount removed from the first mask feature 414 is approximately equal to the amount removed from the second mask feature 416.

Figure 4D:
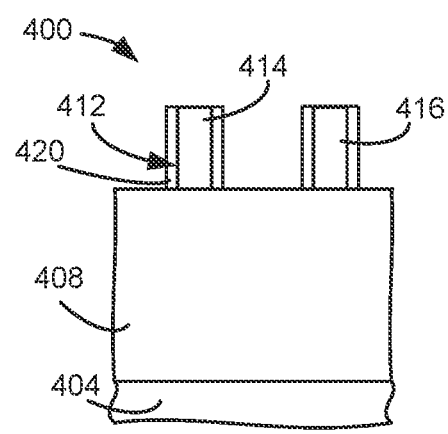

In this example, a separate step is used to etch back the oxide deposition 420 (step 116) to expose part of the carbon based deposition 412. An example recipe for etching back the oxide deposition 420 is a reactive ion etct (RIE) with fluorine containing species. FIG. 4D is a cross sectional view of the stack 400 after the oxide deposition 420 has been etched back.

Figure 4E:
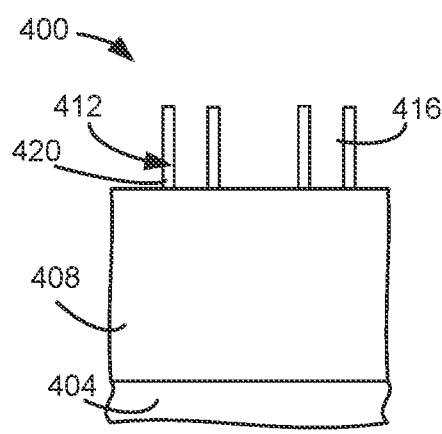

The carbon based deposition is removed (step 120). An example of a recipe would be plasma ashing with oxygen containing species. FIG. 4E is a cross sectional view of the stack 400 after the carbon based deposition has been removed.

Figure 4F:
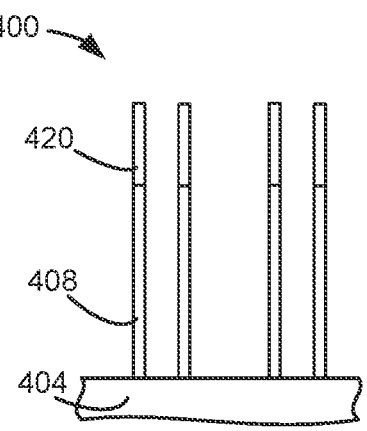

An underlying layer is etched, where the oxide deposition is used as a mask (step 124). In this example, the underlying layer that is etched is the intermediate layer 408, which in this example is polysilicon. FIG. 4F is a cross sectional view of the stack 400 after the intermediate layer 408 is etched.

Figure 8:
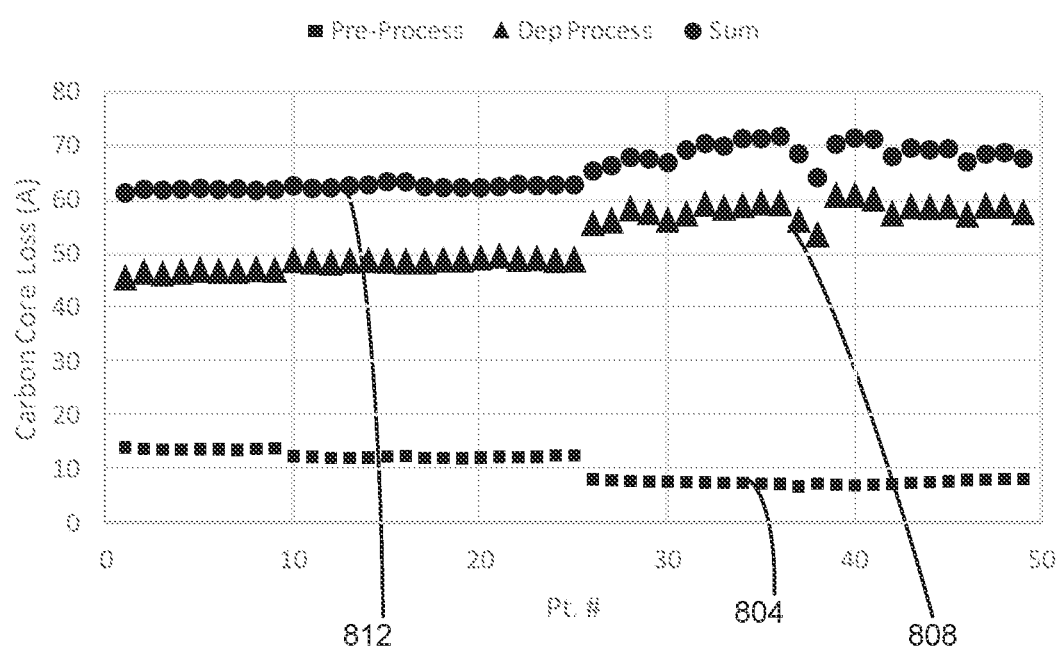
FIG. 8 is a graph of carbon removal according to an embodiment.

FIG. 8 demonstrates how the final carbon based deposition removal profile can be flattened by superposing the loss profiles of the pretuning and depositing the oxide deposition. FIG. 8 shows a graph of the carbon removal caused by the pretuning versus the distance from the center of the wafer 804. A graph of the carbon removal caused by the higher energy oxide deposition versus the distance from the center of the wafer 808 is also shown. The sum of the carbon removed by both the pretuning and the higher energy oxide deposition 812 is also graphed. The sum of the carbon removed by both the pretuning and the higher energy oxide deposition 812 is equivalent to executing the two processes in sequence.

TABLE 1

|  | Dep Process | Sum |
|---|---|---|
| Loss Avg. (A) | 51.07 | 64.74 |
| Loss Range (A) | 12.47 | 6.01 |

Table 1 shows the average loss and the loss range in angstroms of the carbon based deposition caused by the higher energy oxide deposition alone and the sum of the pretuning and the higher energy oxide deposition in an example. In this example, the bowl shaped loss profile of the higher energy oxide deposition process is compensated by the dome shaped profile of the pretuning. The final profile is substantially flatter than that of the higher energy oxide deposition alone, and a corresponding improvement in loss range from 12.5 A for the higher energy oxide deposition alone to 6.0 A for the sum of the loss due to pretuning and the higher energy oxide deposition is observed. In this example, improved uniformity is indicated by the lower range. By properly tailoring the pretuning using available process knobs (tuning inputs), the removal of the carbon based deposition from pretuning may be minimized Preferably, less than 20 Å total of the thickness of the carbon based deposition is removed by the pretuning. More preferably, less than 10 Å total of the thickness of the carbon based deposition is removed by the pretuning. Preferably, the removal or loss range of the carbon deposition by the pretuning and the higher energy oxide deposition is less than 10 Å. More preferably, the removal or loss range of the carbon deposition by the pretuning and the higher energy oxide deposition is less than 5 Å. In various embodiments, a target removal depth is provided, since the target removal depth is used in determining a complex manufacturing process. Providing a process where the thickness of the carbon removed is significantly greater or less than the target removal depth changes the complex manufacturing process in a way that reduces yield. In some embodiments, providing the pretuning increases the thickness of the carbon removed. If only standard higher energy oxide deposition is used then the carbon removed would be greater than the target thickness. Providing lower energy oxide deposition reduces the thickness of the carbon that is removed. By providing a combination of lower energy oxide deposition and higher energy oxide deposition the target removal depth is achieved.

By providing a pretuning that has a non-uniform complementary removal of carbon based deposition with respect to the non-uniform removal of carbon based deposition by the oxide deposition, the above embodiment provides a more uniform pattern. As device sizes shrink, such an improvement increases uniformity and decreases defects.

In various embodiments, the pretuning can be done in-situ immediately preceding depositing the oxide deposition. In various embodiments, the cumulative carbon based deposition removal after the pretuning and depositing the oxide deposition is substantially uniform or otherwise tailored to fulfill a given integration requirement. In an embodiment, the removal of the carbon based deposition by the pretuning is minimized by maximally biasing the etch profile to where the removal caused by the depositing the oxide deposition is minimum. In various embodiments, the pretuning may use a pretuning gas comprising at least one of oxygen, nitrogen, or argon. The pretuning, allows for the tuning of the etch profile, which can be modulated and tailored by varying the respective ratios of the gas components. In addition, pressure and RF power of the pretuning can also be utilized to further tune the etch profile.

In various embodiments, both feedforward and feedback schemes can be utilized as part of the process implementation. For the former, inspection results from after the preceding etch step can be used as inputs to controllers that determine the optimal settings for the pretuning. For the latter, the final CD measurements after oxide deposition and etch can be used as the inputs.

Various embodiments provide independent controllability of the carbon deposition removal. The plasma pretuning has no other function than to pre-tune the loss profile, which gives flexibility in terms of the profiles it can achieve (e.g. bowl, dome, and flat). In some embodiments, pretuning is performed in-situ in the same module as oxide deposition and requires no additional hardware or facilities. For typical desired profiles, the pretuning adds less than ten seconds to the total deposition time thereby minimizing any time impact. The relative flow ratios and rates of different gases such as Ar, $N_2$, and $O_2$ for the pretuning gas are used as control parameters for tuning the non-uniform pretuning of the carbon based deposition.

Figure 9:
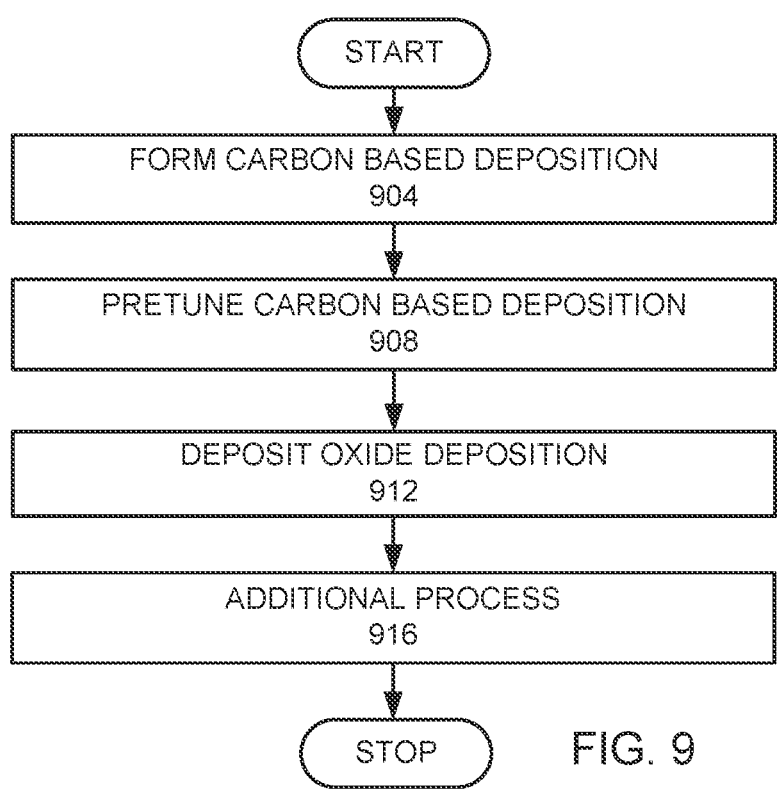
FIG. 9 is a flow chart another embodiment.

FIG. 9 is a high level flow chart of another embodiment. A carbon based deposition is deposited over a wafer (step 904). The carbon based deposition is pretuned where the pretuning causes a non-uniform removal of some of the carbon based deposition (step 908). An oxide deposition is deposited through an ALD process (step 912), where the depositing the oxide deposition causes a non-uniform removal of some of the carbon based deposition. The oxide deposition is a silicon oxide based deposition. At least one additional process is provided (step 916), where the at least one additional process completes formation of features over the wafer, wherein the features are more uniform than features that would be formed without pretuning. For a different process chamber, the process chamber may provide a non-uniform process for the at least one additional process. In such a case, instead of a uniform flat profile after the depositing the silicon oxide, a tailored profile that complements the non-uniformity of the at least one additional process is desired after depositing the oxide deposition, since the process chamber would use the tailored profile to provide more uniform semiconductors across the wafer after the at least one additional process. The pretuning is designed to provide the tailored profile after depositing the oxide deposition, so that the resulting features are more uniform than features formed without the pretuning.

In various embodiments, the oxygen in the pretuning gas provides some ashing to cause some carbon based deposition removal during the pretuning. The argon and nitrogen in the pretuning gas may be used for uniformity control, where the ratio of oxygen to argon to nitrogen is used to tune the profile of the carbon based deposition. In some embodiments, for the pretuning gas the ratio of oxygen to argon is between 2:1 to 1:2.

In various embodiments the carbon based deposition 412 may be amorphous carbon, photoresist, spin on carbon, or chemical vapor deposition (CVD) carbon, or ashable hardmask.

While this disclosure has been described in terms of several preferred embodiments, there are alterations, modifications, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, modifications, permutations, and various substitute equivalents as fall within the true spirit and scope of the present disclosure.

What is claimed is:

1. A method for forming features over a wafer with a carbon based deposition, comprising:
    pretuning the carbon based deposition, wherein the pretuning causes a non-uniform removal of some of the carbon based deposition;
    depositing an oxide deposition through an atomic layer deposition process, wherein the depositing the oxide deposition causes a non-uniform removal of some of the carbon based deposition; and
    providing at least one additional process, wherein the at least one additional process completes formation of features over the wafer, wherein the features are more uniform than features that are formed without pretuning.

2. The method, as recited in claim 1, wherein the features are more uniform across the wafer.

3. The method, as recited in claim 1, further comprising:
removing the carbon based deposition; and
etching an etch layer below the oxide deposition, using the oxide deposition as a mask.

4. The method, as recited in claim 1, wherein the pretuning the carbon based deposition, comprises:
providing a pretuning gas comprising oxygen and at least one of Ar or nitrogen,
transforming the pretuning gas into a plasma, which causes a non-uniform removal of some of the carbon based deposition; and
stopping the pretuning gas.

5. The method, as recited in claim 4, wherein the pretuning gas comprises oxygen and argon, wherein a ratio of the oxygen to argon is between 2:1 to 1:2.

6. The method, as recited in claim 1, wherein the pretuning removes less than 20 Å thickness of the carbon based deposition.

7. The method, as recited in claim 1, wherein the depositing the oxide deposition comprises:
providing a lower energy oxide deposition of a plurality of cycles, wherein each cycle comprises:
flowing a precursor gas;
flowing an oxidation gas;
providing a first RF power to transform the oxidation gas into a plasma; and
providing a higher energy oxide deposition of a plurality of cycles, wherein each cycle comprises:
flowing a precursor gas;
flowing an oxidation gas; and
providing a second RF power to transform the oxidation gas into a plasma, wherein the second RF power is higher than the first RF power.

8. The method, as recited in claim 1, further comprising providing at least one of a feedback or feedforward input to optimize the pretuning.

9. The method, as recited in claim 1, further comprising forming a carbon based deposition over the wafer.

10. The method, as recited in claim 1, wherein the carbon based deposition forms a plurality of mask features and the non-uniform removal of some of the carbon based deposition causes a non-uniformity between the plurality of mask features wherein at least one of the plurality of mask features is etched to a greater degree than the other of the plurality of mask features to provide the non-uniformity.

11. The method, as recited claim 10, where the non-uniformity between the plurality of mask features results into an increased uniformity of the features.

12. The method, as recited in claim 11, wherein the increased uniformity of the features is across the wafer.

* * * * *